United States Patent
Kocon

(10) Patent No.: US 7,592,668 B2
(45) Date of Patent: Sep. 22, 2009

(54) CHARGE BALANCE TECHNIQUES FOR POWER DEVICES

(75) Inventor: Christopher Boguslaw Kocon, Mountain Top, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 257 days.

(21) Appl. No.: 11/396,239

(22) Filed: Mar. 30, 2006

(65) Prior Publication Data

US 2007/0228490 A1  Oct. 4, 2007

(51) Int. Cl.
  *H01L 29/94* (2006.01)
(52) U.S. Cl. .................................. 257/335; 257/341
(58) Field of Classification Search ................ 257/335, 257/341
  See application file for complete search history.

(56) References Cited

U.S. PATENT DOCUMENTS

| | | | |
|---|---|---|---|
| 5,216,275 A | 6/1993 | Chen | |
| 5,545,915 A | 8/1996 | Disney et al. | |
| 6,677,626 B1 | 1/2004 | Shindou et al. | |
| 6,683,363 B2 | 1/2004 | Challa | |
| 6,696,728 B2 | 2/2004 | Onishi et al. | |
| 6,724,042 B2 | 4/2004 | Onishi et al. | |
| 6,768,180 B2 | 7/2004 | Salama et al. | |
| 6,825,565 B2 | 11/2004 | Onishi et al. | |
| 6,982,459 B2 | 1/2006 | Suzuki et al. | |
| 2003/0222327 A1 | 12/2003 | Yamaguchi et al. | |
| 2004/0026735 A1 | 2/2004 | Suzuki et al. | |
| 2005/0077572 A1* | 4/2005 | Yamauchi et al. | 257/341 |
| 2005/0167742 A1 | 8/2005 | Challa et al. | |
| 2005/0224848 A1 | 10/2005 | Kurosaki et al. | |
| 2007/0001230 A1 | 1/2007 | Lee et al. | |
| 2007/0029597 A1 | 2/2007 | Lee et al. | |

FOREIGN PATENT DOCUMENTS

| | | |
|---|---|---|
| WO | WO 2007/106658 A1 | 9/2007 |
| WO | WO 2007/117938 A2 | 10/2007 |

OTHER PUBLICATIONS

Final Office Action mailed Apr. 16, 2008 in U.S. Appl. No. 11/375,683.
Non-Final Office Action mailed Sep. 25, 2008 in U.S. Appl. No. 11/375,683.
International Search Report of Feb. 15, 2008 in PCT Application No. PCT/US07/64696.
International Search Report of Oct. 1, 2007 in PCT Application No. PCT/US07/62817.
Written Opinion of Feb. 15, 2008 in PCT Application No. PCT/US07/64696.
Written Opinion of Oct. 1, 2007 in PCT Application No. PCT/US07/62817.
Sze, S. M., *Physics of Semiconductor Devices*, 2nd edition, pp. 63-108, published by John Wiley & Sons (1981).

* cited by examiner

*Primary Examiner*—Phat X Cao
(74) *Attorney, Agent, or Firm*—Townsend and Townsend and Crew LLP

(57) ABSTRACT

A charge balance semiconductor power device includes an active area comprising a plurality of cells capable of conducting current when biased in a conducting state. A non-active perimeter region surrounds the active area, wherein no current flows through the non-active perimeter when the plurality of cells is biased in a conducting state. Alternately arranged strips of p pillars and strips of n pillars extend through both the active area and the non-active perimeter region along a length of a die housing the semiconductor power device.

7 Claims, 7 Drawing Sheets

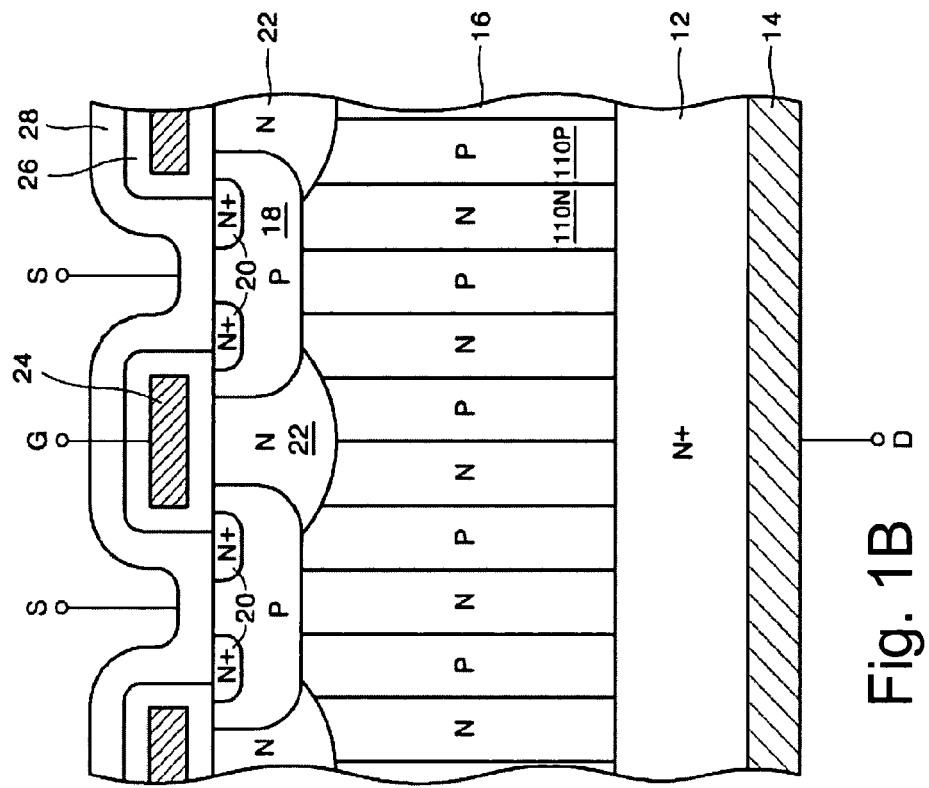
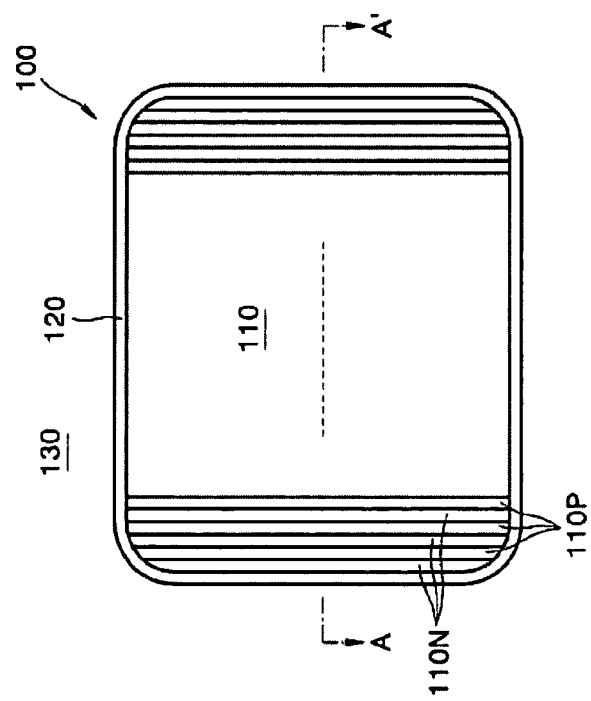
Fig. 1B (Prior art)
Fig. 1A (Prior art)

CHARGE BALANCE TECHNIQUES FOR POWER DEVICES

CROSS-REFERENCES TO RELATED APPLICATIONS

This application is related to the commonly assigned U.S. application Ser. No. 11/026,276, filed Dec. 29, 2004, which disclosure is incorporated herein by reference in its entirety for all purposes.

BACKGROUND OF THE INVENTION

The present invention relates to semiconductor power device technology, and more particularly to charge balance techniques for semiconductor power devices.

A vertical semiconductor power device has a structure in which electrodes are arranged on two opposite planes. When the vertical power device is turned on, a drift current flows vertically in the device. When the vertical power device is turned off, due to a reverse bias voltage applied to the device, depletion regions extending in the horizontal and vertical directions are formed in the device. To obtain a high breakdown voltage, a drift layer disposed between the electrodes is formed of a material having high resistivity, and a thickness of the drift layer is increased. This, however, leads to an increase in the device on-resistance Rdson, which in turn reduces conductivity and the device switching speed, thereby degrading the performance of the device.

To address this issue, charge balance power devices with a drift layer comprising vertically extending n regions (n pillar) and p regions (p pillar) arranged in an alternating manner has been proposed. FIG. 1A is a layout diagram of such a device 100. Device 100 includes an active area 110 surrounded by a non-active perimeter region which includes a p ring 120 and an outer termination region 130. The perimeter p ring 120 has a rectangular shape with rounded corners. Termination region 130 may include similarly shaped alternating p and n rings, depending on the design. Active area 110 includes alternately arranged p pillars 110P and n pillars 110N extending vertically in the form of strips and terminating along the top and bottom at the perimeter ring 120. The physical structure of the alternating p and n pillars in the active area can be seen more clearly in FIG. 1B which shows a cross section view in array region 110 along line A-A' in FIG. 1A.

The power device depicted in FIG. 1B is a conventional planar gate vertical MOSFET with a drift layer 16 comprising alternating p pillars 110P and n pillars 110N. Source metal 28 electrically contacts source regions 20 and well regions 18 along the topside, and drain metal 14 electrically contacts drain region 12 along the bottom-side of the device. When the device is turned on, a current path is formed through the alternating conductivity type drift layer 16. The doping concentration and physical dimensions of the n and p pillars are designed to obtain charge balance between adjacent pillars thereby ensuring that drift layer 16 is fully depleted when the device is in the off state.

Returning back to FIG. 1A, to achieve a high breakdown voltage, the quantity of n charges in the n pillars and the quantity of p charges in p pillars must be balanced in both the active area 110 and at the interface between the active area and the non-active perimeter region. However, achieving charge balance at all interface regions, particularly along the top and bottom interface regions where the p and n pillars terminate into perimeter ring 120, as well as in the corner regions where the n and p pillars have varying lengths, is difficult because of the change in geometry of the various regions. This is more clearly illustrated in FIG. 1C which shows an enlarged view of the upper left corner of power device 100 in FIG. 1A.

In FIG. 1C, a unit cell in active area 110 is marked as S1. Active p pillar 111 (which is divided into a left half portion 111-1 and a right half portion 111-2) and active p pillar 113 (which is divided into left half portion 113-1 and right half portion 113-2) are separated by an n pillar 112. The sum (Qp1+Qp2) of the quantity of p charges-Qp1 in the right half portion 111-2 of the active p pillar 111 and the quantity of p charges Qp2 in the left half portion 113-1 of the active p pillar 113 in unit cell S1 is equal to the quantity of n charges Qn1 in the active n pillar 112. An optimum breakdown voltage is thus achieved in all parts of active area 110 where such balance of charge is maintained.

As shown, the corner portion of the non-active perimeter region includes the perimeter p ring 120 and termination region 130 with n ring 131 and p ring 132 which are arranged in an alternating manner. Perimeter p ring 120 (which is divided into a lower half portion 121 and an upper half portion 122) and termination region p ring 132 (which is divided into lower half portion 132-1 and upper half portion 132-2) are separated by n ring 131. The sum (Qpt1+Qpe) of the quantity of p charges Qpt1 in the lower half portion 132-1 of p ring 132 and the quantity of p charges Qpe in the upper half portion 122 of ring 120 in unit cell S2 is equal to the quantity of n charges Qnt in n ring 131. An optimum breakdown voltage is thus achieved in all parts of the non-active perimeter region where such balance of charge is maintained.

However, because of geometrical limitations, the quantity of p charges and the quantity of n charges at the interface between the active area and the non-active perimeter region are unbalanced in many places. The absence of charge balance in these regions results in a deterioration of the breakdown characteristics of the device. Thus, there is a need for charge balance techniques which eliminate the prior art charge imbalance problems at the active area to non-active perimeter region interface, thereby leading to higher breakdown voltage ratings.

BRIEF SUMMARY OF THE INVENTION

In accordance with an embodiment of the invention, a charge balance semiconductor power device includes an active area comprising a plurality of cells capable of conducting current when biased in a conducting state. A non-active perimeter region surrounds the active area. No current flows through the non-active perimeter region when the plurality of cells is biased in the conducting state. Alternately arranged strips of first conductivity type pillars and strips of second conductivity type pillars extend through both the active area and the non-active perimeter region along a length of a die which houses the semiconductor power device.

In one embodiment, each of the strips of first conductivity type pillars includes a discontinuity forming a portion of a strip of second conductivity type region. The strip of second conductivity type region extends in the non-active perimeter region perpendicular to the length of the die.

In another embodiment, each of the strips of first conductivity type pillars includes a plurality of discontinuities forming portions of a plurality of strips of second conductivity type regions. The plurality of strips of second conductivity type regions extend in the non-active perimeter region perpendicular to the length of die.

In accordance with another embodiment of the invention, a charge balance semiconductor power device includes an active area comprising a plurality of cells capable of conducting current when biased in a conducting state. A non-active perimeter region surrounds the active area. No current flows through the non-active perimeter region when the plurality of cells is biased in the conducting state. Strips of p pillars and strips of n pillars are arranged in an alternating manner. The strips of p and n pillars extend through both the active area and the non-active perimeter region along a length of a die housing the semiconductor power device. Each of the strips of p pillars includes a plurality of discontinuities forming portions of a plurality of strips of n regions. The plurality of strips of n regions extends in the non-active perimeter region perpendicular to the length of the die.

A further understanding of the nature and the advantages of the invention disclosed herein may be realized by reference to the remaining portions of the specification and the attached drawings.

BRIEF DESCRIPTION OF THE DRAWINGS

FIG. 1A shows a simplified layout diagram of a conventional charge balance power device;

FIG. 1B shows a cross section view along A-A' line in the power device in FIG. 1C;

DETAILED DESCRIPTION OF THE INVENTION

Figure 2:
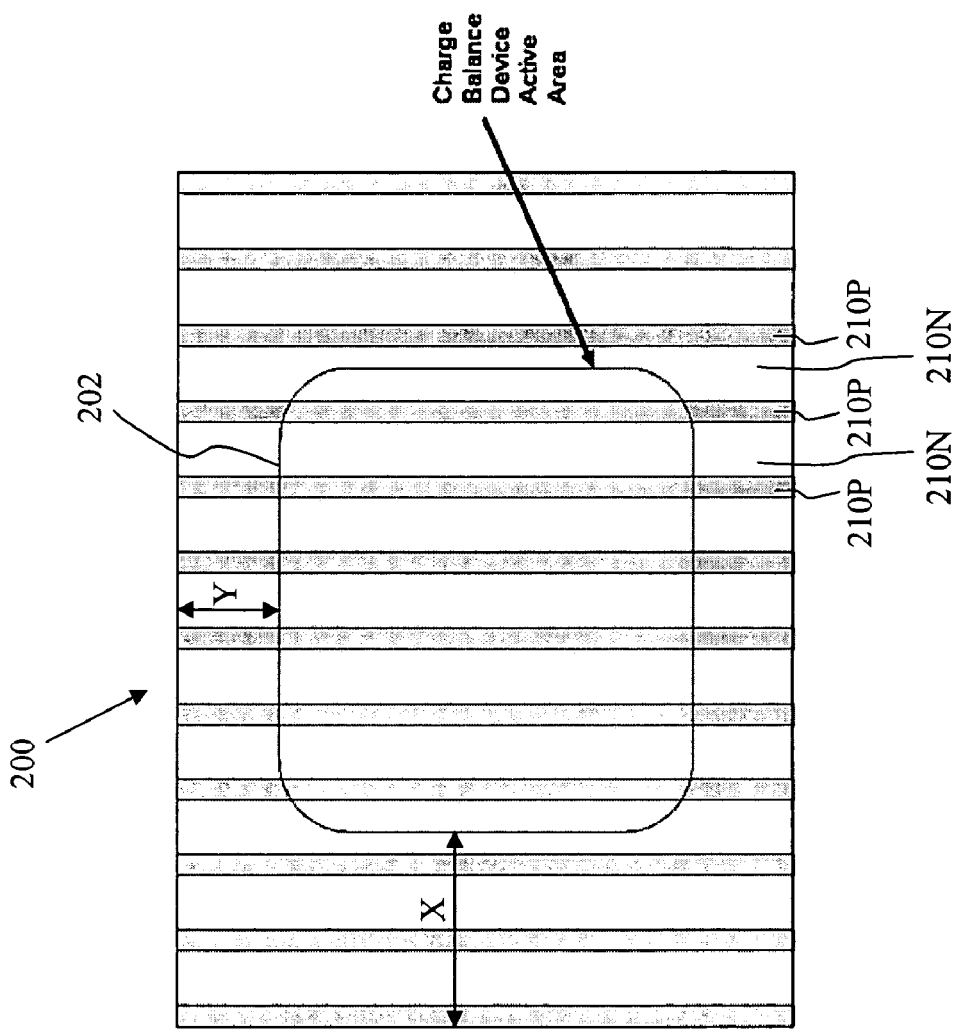
FIG. 2 shows a simplified layout diagram for charge balance power devices in accordance with an exemplary embodiment of the invention.
Figure 3:
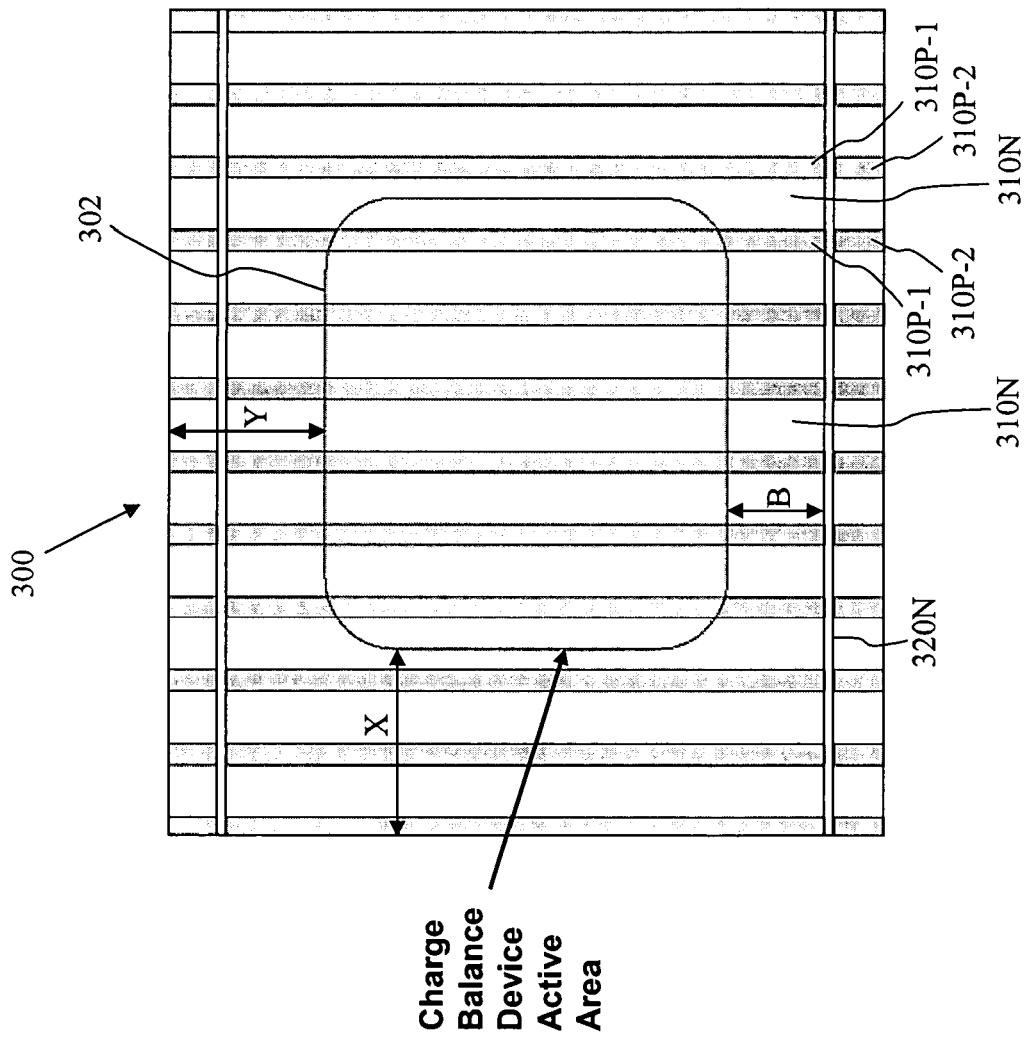
FIG. 3 shows a simplified layout diagram for charge balance power devices in accordance with another exemplary embodiment of the invention.
Figure 4:
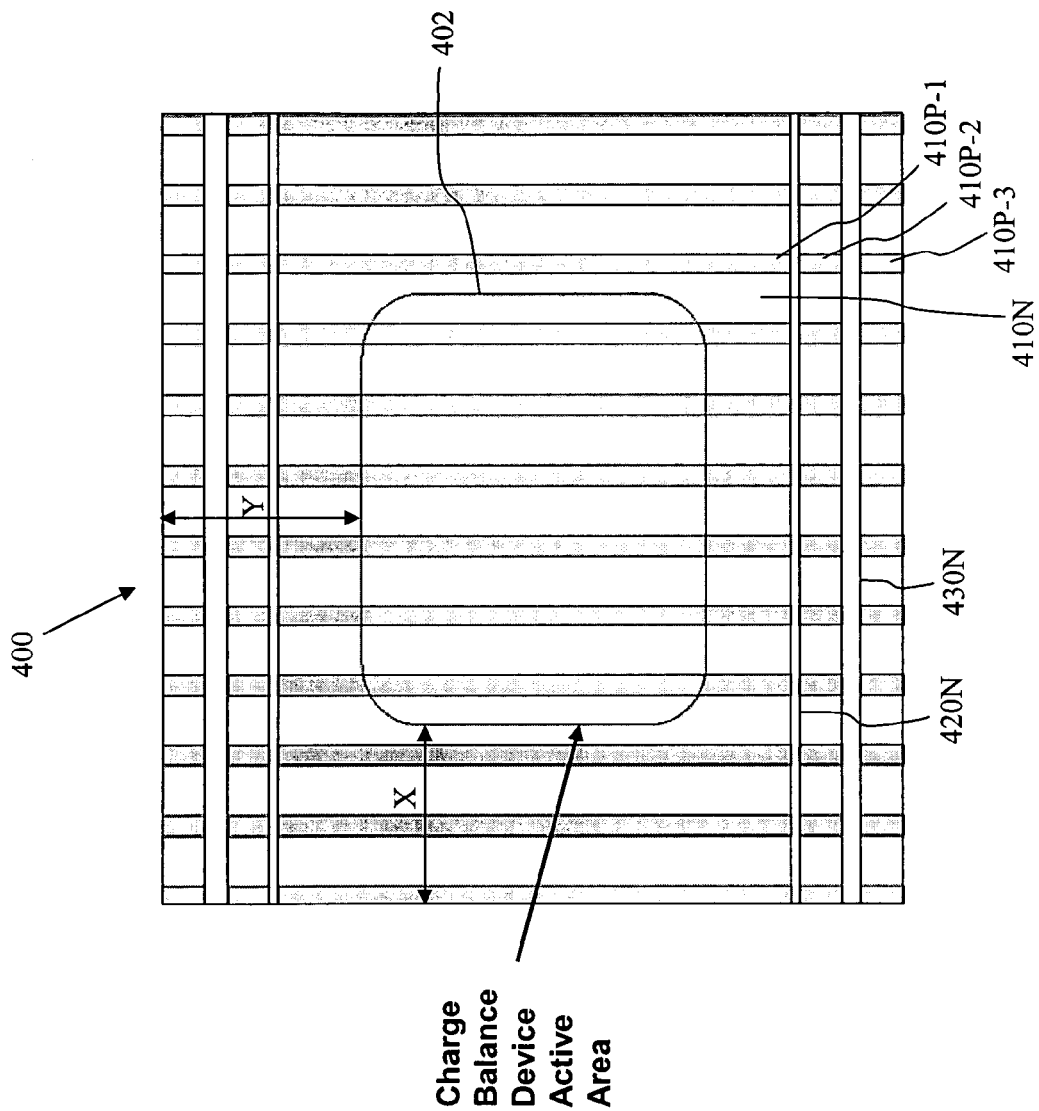
FIG. 4 shows a simplified layout diagram for charge balance power devices in accordance with yet another exemplary embodiment of the invention.

FIGS. 2-4 show simplified layout diagrams of dies wherein improved charge balance techniques are implemented in accordance with three exemplary embodiments of the invention. These techniques advantageously eliminate the intricate design necessary to achieve charge balance at the transition region between the active area and its surrounding non-active perimeter region in prior art charge balance devices.

In FIG. 2, a die 200 housing a charge balance power device comprises an active area 702 wherein many active cells are formed, and a non-active perimeter region surrounding the active area. The non-active perimeter region is defined by the distance from the horizontal edges of active area 702 to corresponding edges of the die marked in FIG. 2 by letter X, and by the distance from the vertical edges of active area 702 to corresponding edges of the die marked in FIG. 2 by letter Y. In general, the term "active area" is used herein to identify the region of the device in which active cells capable of conducting current are formed, and the term "non-active perimeter region" is used to identify the region of the device in which non-conducting structures are formed.

Figure 1C:
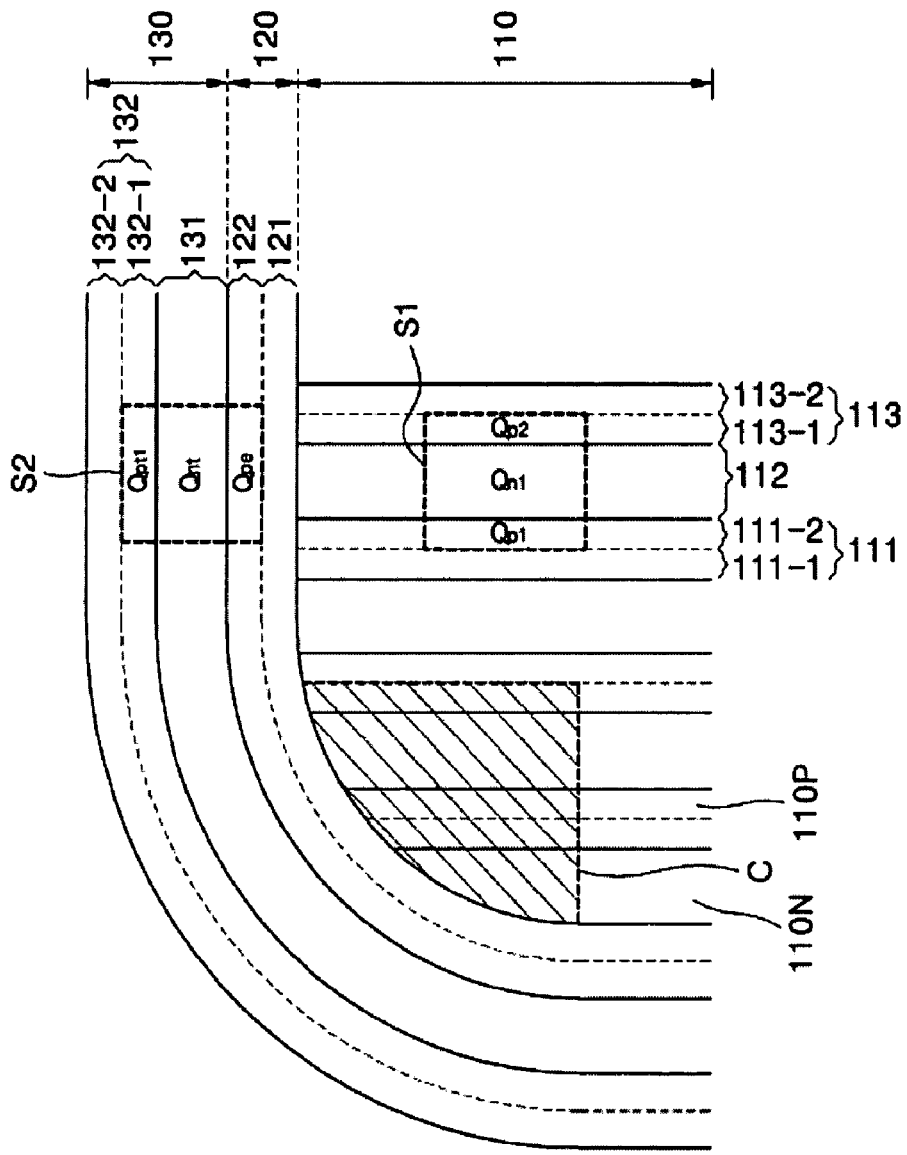
FIG. 1C shows an enlarged view of the upper left corner of the power device in FIG. 1A.

Distances X and Y in FIGS. 2-4 are significantly exaggerated in order to more clearly show the charge balance technique in these figures (in practice, distances X and Y are significantly smaller than those shown in FIG. 2-4). Where the power device housed in die 200 is a MOSFET (e.g., similar to that in FIG. 1B), the boundary of active area marked in FIG. 2 by reference numeral 202 corresponds to the boundary of the well region in which the MOSFET cells are formed.

As shown in FIG. 2, vertically extending p pillars 210P and n pillars 210N are arranged in an alternating manner to thereby form a charge balance structure. In one embodiment, active p pillars 210P are formed by creating trenches in the silicon and filling them with p-type silicon using known techniques such as selective epitaxial growth (SEG). In general, the physical dimensions and doping concentration of the n and p pillars are optimized so as to obtain charge balance between adjacent pillars, similar to that described above in connection with unit cell S1 in FIG. 1C.

In FIG. 2, unlike conventional charge balance devices wherein the p and n pillars in the active area terminate at the boundary of the active area, the active p and n pillars extend through both the active area and the non-active perimeter region, as shown. This eliminates the charge balance concerns at the edges and corners of the active area, thus achieving perfect charge balance and breakdown characteristics while significantly simplifying the design of the device.

In one embodiment, distances X and Y are chosen to ensure full depletion outside the active area. In one embodiment wherein p pillars are formed by forming trenches in silicon, each of distances X and Y is equal to or greater than a depth of the p pillar trenches. While the vertical edges of active area 202 are shown in FIG. 2 to fall within n pillars, the active area could be expanded or contracted so that the vertical edges of the active area fall within p pillars. As such, there are no misalignment issues with respect to the edges of active area 202 and the pillars. In one embodiment, the starting wafer may include the p and n pillars as shown in FIG. 2, and the power device including its active area and other regions are formed using known manufacturing techniques.

FIG. 3 shows another embodiment which is similar to that in FIG. 2 except a discontinuity is formed in the vertically extending p pillars in each of the upper and lower non-active perimeter region. The discontinuities form a horizontally extending n strip 320N which breaks up each p pillar into two portions 310P-1 and 310P-2 as shown in the lower non-active perimeter region. The discontinuity in the p pillars disturbs the fields in the non-active perimeter region so as to reduce the fields along the silicon surface in this region. This helps improve the breakdown voltage in the non-active perimeter region.

In one embodiment, a spacing B from the edge of active area 302 to n strip 320N is determined based on the voltage rating of the power device, photo tool limitations, and other performance and design goals. In one embodiment, a smaller spacing B is used enabling finer field distribution adjustments. Once again, the dimensions in the non-active perimeter region (X, Y, B) are all exaggerated to more easily illustrate the various features of the invention.

FIG. 4 shows a variation of the FIG. 3 embodiment wherein multiple discontinuities are formed in each p pillar in each of the upper and lower non-active perimeter regions, thus forming multiple n strips 420N, 430N in these regions. Multiple discontinuities enable higher voltage ratings. As shown, outer strip 430N is wider than inner strip 420N. The considerations in selecting the widths of the N strips and the spacing therebetween are similar to those for conventional termination guard rings. In one embodiment, the n strips in FIGS. 3 and 4 are formed as follows. During the process of forming the p pillars, a mask is used to prevent formation of p pillars at the gap locations along the p pillars.

The techniques in FIGS. 2-4 may be combined with other edge termination techniques as needed. In particular, termination field plate techniques may be advantageously combined with the embodiments in FIGS. 2-4 to further reduce the fields at the silicon surfaces in the non-active perimeter region. Two examples of such combination are shown in FIGS. 5 and 6.

Figure 5:
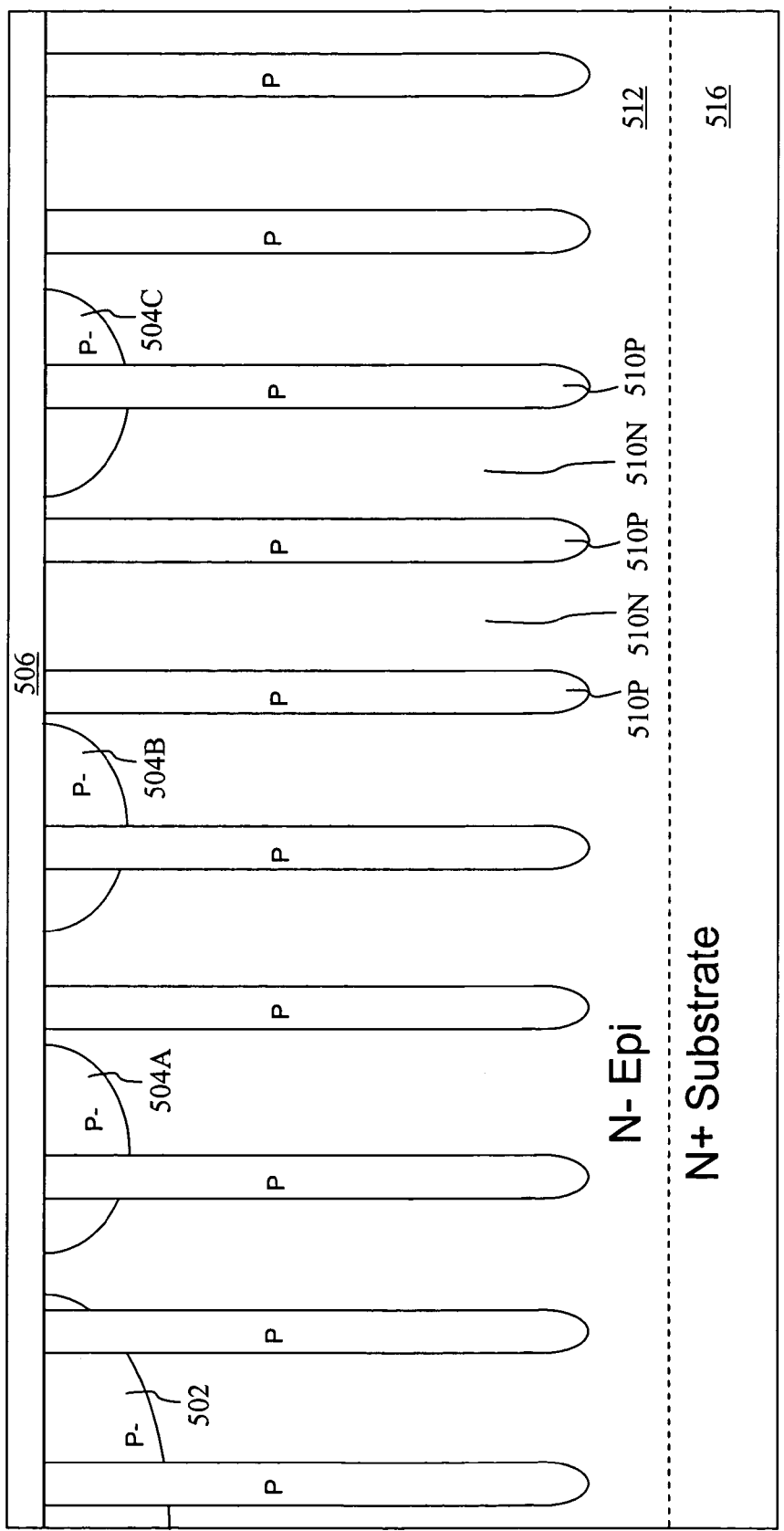
FIGS. 5 and 6 show simplified cross section views of the non-active perimeter region wherein field plates are integrated with charge balance structures according to two exemplary embodiments of the invention.

FIG. 5 shows a cross section view along a region of the die at an edge of the active area. In FIG. 5, the active area extends to the left of p-well 502, and the non-active perimeter region extends to the right of p-well 502. As in FIGS. 2-4 embodiment, p-pillars 510P and n-pillar 510N extend through both the active area and non-active perimeter region. As shown, p-pillars 510P terminate at a depth within N-epitaxial layer 512, and those portions of N-epitaxial layer 512 extending between p-pillars 510P form the n-pillars 510N of the charge balance structure. Floating p-type diffusion rings 504A-504C are formed in the non-active perimeter region and extend around the active region. As can be seen, the spacing between adjacent rings progressively increases in the direction away from the active region. A dielectric layer 506 insulates rings 504A-504C from overlying structures (not shown). P-well 502 may either be the last p-well of the active area or form part of the termination structure. In either case, p-well 502 would be electrically connected to the active p-well.

Figure 6:
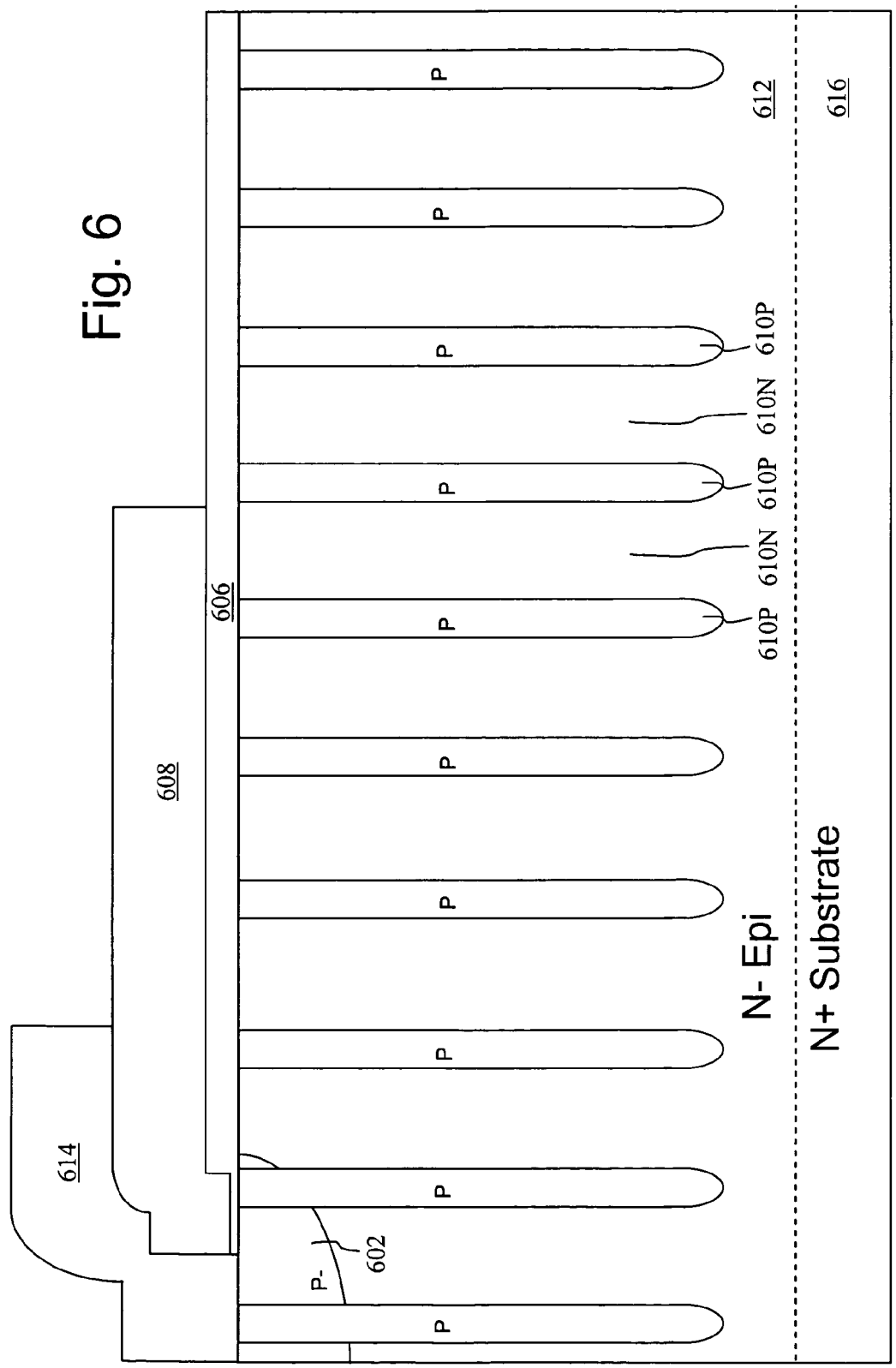

FIG. 6, similar to FIG. 5, shows a cross section view of a region of the die at an edge of the active area, with the active area extending to the left of p-well 602 and the termination region extending to the right of p-well 502. P-pillars 610P and n-pillar 610N extend through both the active and termination regions. As in the FIG. 5 embodiment, p-pillars 610P terminate at a depth within N-epitaxial layer 612, and those portions of N-epitaxial layer 612 extending between p-pillars 610P form the n-pillars 610N of the charge balance structure. In this embodiment however, a planar field plate structure is formed over the non-active perimeter region. The planar field plate structure includes a polysilicon layer 608 extending over the non-active perimeter region, and a metal contact layer 614 electrically connects polysilicon layer 608 to p-well 602. A dielectric layer 606 insulates the charge balance structure in the non-active perimeter region from the overlying polysilicon layer 608 and other structures not shown. As in the FIG. 5 embodiment, p-well 602 may either be the last p-well of the active area or form part of the termination structure. In either case, p-well 502 would be electrically connected to the active p-well.

While FIGS. 5 and 6 show two different edge termination techniques, these two techniques may be combined in a variety of ways. For example, in an alternate implementation of the FIG. 6 embodiment, a number of floating p-type diffusion rings are included in the non-active perimeter region in similar manner to that in FIG. 5 except that the p-type diffusion rings are placed to the left of field plate 608. As another example, in an alternate implementation of the FIG. 5 embodiment, a separate planar field plate is connected to each floating p-type diffusion ring 504A-504C.

The various charge balance techniques disclosed herein may be integrated with the vertical planar gate MOSFET cell structure shown in FIG. 1B, and other charge balance MOSFET varieties such as trench gate or shielded gate structures, as well as other charge balance power devices such as IGBTs, bipolar transistors, diodes and schottky devices. For example, the various embodiments of the present invention may be integrated with any of the devices shown for example, in FIGS. 14, 21-24, 28A-28D, 29A-29C, 61A, 62A, 62B, 63A of the above-referenced U.S. patent application Ser. No. 11/026,276, filed Dec. 29, 2004 which disclosure is incorporated herein by reference in its entirety for all purposes.

While the above provides a detailed description of various embodiments of the invention, many alternatives, modifications, and equivalents are possible. Also, it is to be understood that all numerical examples and material types provided herein to describe various embodiments are for illustrative purposes only and not intended to be limiting. For example, the polarity of various regions in the above-described embodiments can be reversed to obtain opposite type devices. For this and other reasons, therefore, the above description should not be taken as limiting the scope of the invention as defined by the claims.

What is claimed is:

1. A charge balance semiconductor power device, comprising:
    an active area comprising a plurality of cells capable of conducting current when biased in a conducting state;
    a non-active perimeter region surrounding the active area, wherein no current flows through the non-active perimeter region when the plurality of cells are biased in the conducting state; and
    alternately arranged strips of first conductivity type pillars and strips of second conductivity type pillars formed in a silicon region of the second conductivity type, the strips of first conductivity type pillars having a depth, a width and a length, the alternately arranged strips of first and second conductivity type extending along their length through both the active area and the non-active perimeter region, wherein each of the strips of first conductivity type pillars includes a discontinuity along its length forming a portion of a strip of second conductivity type region extending in the non-active perimeter region perpendicular to the strips of first conductivity type pillars.

2. The charge balance semiconductor power device of claim 1 wherein each of the strips of first conductivity type pillars includes a plurality of discontinuities forming portions of a plurality of strips of second conductivity type regions extending in the non-active perimeter region perpendicular to the strips of first conductivity type pillars.

3. The charge balance semiconductor power device of claim 1 wherein the charge balance semiconductor power device is a vertically-conducting power device.

4. The charge balance semiconductor power device of claim 1 wherein the first conductivity type is p type and second conductivity type is n type.

5. The charge balance semiconductor power device of claim 1 further comprising a field plate in the non-active termination region.

6. The charge balance semiconductor power device of claim 1 wherein the non-active perimeter region comprises a plurality of rings of the first conductivity type extending around the active area.

7. The charge balance semiconductor power device of claim 1 further comprising a field plate conductor extending into the non-active perimeter region, wherein a portion of the field plate conductor is insulated from underlying strips of first conductivity type pillars and strips of second conductivity type pillars by a dielectric layer.

* * * * *